United States Patent [19]
Rinne et al.

[11] Patent Number: 6,117,299
[45] Date of Patent: Sep. 12, 2000

[54] METHODS OF ELECTROPLATING SOLDER BUMPS OF UNIFORM HEIGHT ON INTEGRATED CIRCUIT SUBSTRATES

[75] Inventors: Glenn A. Rinne; Christine Lizzul, both of Cary, N.C.

[73] Assignee: MCNC, Research Triangle Park, N.C.

[21] Appl. No.: 08/854,075

[22] Filed: May 9, 1997

[51] Int. Cl.[7] .................................................. C25D 5/02
[52] U.S. Cl. ........................................ 205/125; 205/123
[58] Field of Search .................................... 438/466, 613, 438/617, 614; 205/122, 123, 125, 170, 182, 183, 184

[56] References Cited

U.S. PATENT DOCUMENTS

| | | |
|---|---|---|
| 3,625,837 | 12/1971 | Nelson et al. . |
| 3,760,238 | 9/1973 | Hamer et al. ................... 317/234 R |
| 4,142,202 | 2/1979 | Csillag et al. . |
| 4,205,099 | 5/1980 | Jones et al. ......................... 427/90 |
| 4,784,972 | 11/1988 | Hatada ............................. 437/182 |
| 4,948,754 | 8/1990 | Kondo et al. ..................... 437/183 |
| 4,982,265 | 1/1991 | Watanabe et al. ................... 357/75 |
| 5,138,438 | 8/1992 | Masayuki et al. ................... 357/75 |
| 5,162,257 | 11/1992 | Yung ................................ 437/183 |
| 5,289,631 | 3/1994 | Koopman et al. .................. 29/840 |

(List continued on next page.)

FOREIGN PATENT DOCUMENTS

| | | |
|---|---|---|
| 57 073953 | 8/1982 | Japan . |
| 5-166815 | 7/1993 | Japan . |

OTHER PUBLICATIONS

Schiesser et al., Microdynamic Solder Pump vs Alternatives Comparative Review of Solder Bumping Techniques for Flip Chip Attach, SMI Proceedings of The Technical Program, Aug. 19–31, 1995, pp. 171–178.

Han et al., Electroplated Solder Joints for Optoelectronic Applications, 1996 Proceedings, 46th Electronic Components & Technology Conference, May 28–31, 1996, pp. 963–966.

Salonen et al., A Flip Chip Process Based on Electroplated Solder Bumps, Physica Scripta, vol. T54, Jun. 1994, pp. 230–233.

(List continued on next page.)

*Primary Examiner*—Bruce F. Bell
*Assistant Examiner*—Erica Smith-Hicks
*Attorney, Agent, or Firm*—Alston & Bird LLP

[57] ABSTRACT

Methods of electroplating solder bumps of uniform height on integrated circuit substrates include the steps of drawing plating current through an integrated circuit wafer by electrically shorting an integrated circuit's ground, power and signal pads together using an ultra-thin plating base layer (e.g., <0.075 μm thick) and then using a backside wafer contact to draw electroplating current along parallel paths which extend through the ground and signal pads and into the substrate. The ground pads are preferably electrically coupled to the substrate at substrate contact regions (e.g., N + or P + diffusion regions) and the signal pads are preferably electrically coupled to the substrate through active semiconductor devices (e.g., FETs, BJTs, . . . ) to which the signal pads are attached. Plating current is preferably drawn in parallel through an integrated circuit's active semiconductor devices and substrate contact regions. The combined contributions of the plating currents drawn through the substrate contact regions and the active semiconductor devices is sufficient to maintain the plating base layer and underlying pads at uniform potentials even though the plating base layer has a preferred thickness of less than about 0.075 μm. These uniform and typically non-zero potentials cause the rates of electroplating to be highly uniform across the wafer by limiting lateral current flow through the plating base layer. The uniformity of the electroplated solder bumps can also be enhanced by using high density controlled collapse chip connection (C4) ("flip-chip") technologies and by interspersing the ground and signal pads on each "flip-chip" so that each signal pad has at least one ground pad as a nearest neighbor.

27 Claims, 3 Drawing Sheets

U.S. PATENT DOCUMENTS

| | | | |
|---|---|---|---|
| 5,293,006 | 3/1994 | Yung | 174/261 |
| 5,342,495 | 8/1994 | Tung et al. | 204/297 R |
| 5,418,186 | 5/1995 | Park et al. | 437/183 |
| 5,492,863 | 2/1996 | Higgins, III et al. | 437/183 |
| 5,503,286 | 4/1996 | Nye, III et al. | 216/13 |
| 5,508,229 | 4/1996 | Baker et al. | 437/183 |
| 5,543,032 | 8/1996 | Datta et al. | 205/670 |
| 5,587,341 | 12/1996 | Masayuki et al. | 437/206 |
| 5,597,469 | 1/1997 | Cary et al. | 205/118 |
| 5,662,788 | 9/1997 | Sandhu et al. | 205/87 |
| 5,736,456 | 4/1998 | Akram | 438/614 |
| 5,793,117 | 8/1998 | Shimada et al. | 257/780 |

OTHER PUBLICATIONS

Datta et al., Electrochemical Fabrication of Mechanically Robust PbSn C4 Interconnections, J. Electrochem. Soc., vol. 142, No. 11, Nov. 1995, pp. 3779–3785.

Yu et al., Solder Bump Fabrication By Electroplating For Flip–Chip Applications, Fifteenth IEEE/CHMT International Electronics Manufacturing Technology Symposium, Oct. 4–6, 1993, pp. 277–281.

Rinne et al., Advanced Solder Flip Chip Processes, Proceedings of The Technical Program, vol. I, Sep. 10–12, 1996, pp. 282–292.

Yung et al., Electroplated Solder Joints for Flip–Chip Applications, IEEE Transactions on Components, Hybrids, and Manufacturing Technology, vol. 14, No. 3, Sep. 1991, pp. 549–559.

Jung et al., Reliability Investigations of Different Bumping Processes for Flip Chip and TAB Applications, Nineteenth IEEE/CPMT International Electronics Manufacturing Technology Symposium, Oct. 14–16, 1996, pp. 274–281.

Lin et al., Approaching a Uniform Bump Height of the Electroplated Solder Bumps on a Silicon Wafer, IEEE Transactions on Components, Packaging, and Manufacturing Technology, Part B, vol. 19, No. 4, Nov. 1996, pp. 747–751.

Yung et al., Flip–Chip Process Utilizing Electroplated Solder Joints, IEPS. Proceedings of the Technical Conference, 1990 International Electronics Packaging Conference, Sep. 1990, pp. 1065–1079.

Adema et al., Flip Chip Technology: A Method for Providing Known Good Die with High Density Interconnections, SPIE Proceedings, International Conference and Exhibition, Multichip Modules, vol. 2256, Apr. 13–15, 1994, pp. 41–49.

DelMonte LA, *Fabrication of Gold Bumps for Integrated Circuit Terminal Contact*, 23$^{rd}$ Electronic Components Conference, Washington, D.C. May 14–16, 1973, PP. 21–25, XP002106381.

Database WPIL on Questel, Week 8144 London, Derwent Publications Ltd., AN 81–80514 D, Class H01B, JP 56–118210 A (HITACHI KK), abstract date not available.

METHODS OF ELECTROPLATING SOLDER BUMPS OF UNIFORM HEIGHT ON INTEGRATED CIRCUIT SUBSTRATES

FIELD OF THE INVENTION

This invention relates to microelectronic device manufacturing methods and more particularly to methods of forming electrical and mechanical connections on microelectronic substrates, and the connections so formed.

BACKGROUND OF THE INVENTION

A limited number of technologies are typically used in the microelectronics industry to provide electrical and mechanical interconnection to microelectronic devices such as integrated circuit chips. These technologies typically include tape automated bonding (TAB), wire bonding and controlled collapse chip connection (C4). Of these three connection technologies, C4 technology is capable of handling the highest density of input/output (I/O) pads because it typically uses a two-dimensional and closely spaced array of solder bumps to cover an entire surface of an integrated circuit chip. In particular, C4 technology typically utilizes solder bumps formed on wettable metal pads on a chip and a mirror image footprint of wettable metal pads on an opposing substrate to which the chips are soldered. Because the chips are typically soldered face-down to a substrate, C4 technology is typically referred to as "flip-chip" technology. C4 technology offers additional advantages because the shorter interconnect distances provided by the closely spaced bumps yield faster signal response time, low inductance and reduced simultaneous switching noise. The evenly distributed array of solder bumps can also be utilized to provide uniform power and heat distribution. Chip design flexibility is also improved using flip-chip technology.

Fabrication of lead-tin (PbSn) C4 solder bumps by evaporation using a metal mask was originally pioneered by IBM in the mid 1960s. However, evaporation is typically an inefficient technique since often more than 95% of the evaporated material ends up on the walls of the evaporator and metal mask. To address this problem, many techniques for electroplating solder bumps have been proposed as alternatives to evaporation. In these electroplating techniques, a blanket under-bump metal (UBM) layer is typically deposited on a microelectronic substrate (e.g., wafer) by evaporation or sputtering. This continuous UBM layer is typically provided on the contact pads and between the pads so that plating current can be drawn laterally through the UBM layer to the edge of the wafer where it is typically collected by a plurality of circumferentially spaced contact pins. The use of contact pins to withdraw lateral current from a UBM layer is more fully described in U.S. Pat. No. 5,342,495 to Tung et al. entitled *Structure for Holding Integrated Circuit Dies to be Electroplated.*

In order to define the sites for solder bump formation over the contact pads, a thick layer of photoresist is deposited on the UBM layer and then photolithographically patterned to expose portions of the UBM layer extending opposite the contact pads. Solder bumps are then formed by electroplating the exposed portions of the UBM layer. The portions of the UBM layer extending between the solder bumps are then etched (using the solder bumps as an etching mask) to break the electrical connection between the solder bumps. As will be understood by those skilled in the art, the patterning and etching steps define the geometry of the resulting UBM contact regions which provide electrical and mechanical connections between the solder bumps and the contact pads.

A recently developed electroplating technique is also described in an article by Datta et al. entitled *Electrochemical Fabrication of Mechanically Robust PbSn C4 Interconnections,* J. Electrochem. Soc., Vol. 142, No. 11, pp. 3779–3785, November (1995). In particular, the Datta et al. article describes a process in which a continuous seed layer is vacuum deposited over a patterned silicon dioxide or polyimide layer on a face of an integrated circuit chip. A thick dry film photoresist layer is then laminated over the seed layer and patterned to define the desired C4 pattern as openings in the photoresist layer. Solder bumps are then formed on the seed layer by electroplating a PbSn solder alloy into the openings using the patterned photoresist layer as a plating mask. The seed layer is then removed to isolate the C4 solder bumps. As described by Datta et al., the seed layer performs a dual function because it provides an electric current path for electrodeposition and, after being etched, it becomes the ball limiting metallurgy (BLM) for the solder bumps by providing both mechanical and electrical connection to the chip. The seed layer is also described as comprising at least two layers: an adhesion layer and a solderable layer. These layers are each described as having thicknesses in a range between about 0.1–0.5 $\mu$m (1000–5000 Å).

Another technique for electroplating solder bumps is described in an unexamined Japanese patent application No. 05-166815 by Matsumura, entitled *Plating Bump Formation Method and Wafer Plating Jigs.* The Matsumura application describes using a backside contact to draw plating current through a wafer 5. The plating current is drawn in a vertical direction through a plurality of wafer dicing streets or scribe lines 5a which are patterned between adjacent chips. In particular, a barrier metal layer 9 is formed over an entire surface of the wafer 5 using a sputter vapor deposition technique. The barrier metal layer 9 contacts the wafer 5 at the dicing streets 5a and provides a conductive path for the plating current to enter the substrate.

The technique described by Matsumura exposes the wafer surface during back-end processing steps. However, exposure of the surface of a wafer between adjacent chips can be difficult from a process standpoint when performed at the end of processing, and can result in reduced chip yield and wafer contamination. Moreover, in order to provide a low resistance lateral current path, the barrier metal layer 9 may need to be relatively thick, which means that subsequent removal of the barrier metal layer 9 may also be difficult and lead to over-etching of regions adjacent and underlying the barrier metal layer 9 and solder bumps. Parasitic Schottky contacts may also form between the barrier metal layer 9 and the exposed dicing streets and cause a reduction in the rate of electroplating and uniformity of the electroplated solder bumps.

Other techniques for electroplating solder bumps are also described in articles by Rinne et al. entitled *Advanced Solder Flip Chip Processes,* Proc. Surface Mount International: Advanced Electronics Manufacturing Technologies, San Jose, Calif., Vol. 1, pp. 282–292, September (1996); Adema et al. entitled *Flip Chip Technology: A Method for Providing Known Good Die with High Density Interconnections,* Proc. 3rd International Conference on Multichip Modules, SPIE Vol. 2256, pp. 41–49 (1994); Yung et al. entitled *Electroplated Solder Joints for Flip-Chip Applications,* IEEE Trans. on Components, Hybrids and Manufacturing Tech., Vol. 14, No. 3, pp. 549–559, September (1991); and Yung et al. entitled *Flip-Chip Process Utilizing Electroplated Solder Joints,* Proc. 1990 International Electronics Packaging Conference, Marlborough, Mass., pp. 1065–1079, September (1990). Commonly assigned U.S. Pat. Nos. 5,162,257 and 5,293,006 to Yung also describe methods of electroplating solder bumps for flip-chip applications, the disclosures of which are hereby incorporated herein by reference.

An article by Lin et al. entitled *Approaching a Uniform Bump Height of the Electroplated Solder Bumps on a Silicon Wafer*, IEEE Trans. on Components, Packaging and Manufacturing Tech.—Part B, Vol 19., pp. 747–751, No. 4, November (1996), also describes an electroplating cell design for achieving uniform solder bump height by manipulating the plating current density through individual solder bumps. In particular, according to Lin et al, the uniformity of the thicknesses of the electroplated solder bumps can best be achieved by manipulating the ratio between the width of the silicon wafer and the width of the electrolytic bath exposed to the wafer during the electroplating step.

However, notwithstanding these conventional electroplating techniques, there still continues to be a need for methods of electroplating solder bumps which do not require the exposure of dicing streets during back-end processing or the fabrication of elaborate electroplating cell designs for manipulating the plating current density through individual solder bumps.

SUMMARY OF THE INVENTION

It is therefore an object of the present invention to provide improved methods of forming solder bumps on integrated circuit substrates.

It is another object of the present invention to provide improved methods of electroplating solder bumps of uniform height on integrated circuit substrates.

It is still another object of the present invention to provide solder bump electroplating methods which eliminate the need to expose dicing streets during solder bump formation.

These and other objects, features and advantages are provided, according to the present invention, by methods of electroplating solder bumps on integrated circuit wafers using backside wafer contacts to draw electroplating current vertically through the wafers. These methods include the steps of drawing plating current through an integrated circuit wafer by electrically shorting an integrated circuit's ground, power and signal pads together using an ultra-thin plating base layer (e.g., <0.075 μm thick) and then using a backside wafer contact to draw electroplating current along vertical paths which extend in parallel through the ground and signal pads and into the substrate. The ground pads are preferably electrically coupled to the substrate at substrate contact regions (e.g., N + or P + diffusion regions) and the signal pads are preferably electrically coupled to the substrate through active semiconductor devices (e.g., field-effect transistors ("FETs"), bipolar junction transistors ("BJTs") to which the signal pads are directly or indirectly attached.

In particular, plating current is preferably drawn in parallel through an integrated circuit's active semiconductor devices and substrate contact regions. However, plating current is not drawn laterally to the wafer's dicing streets so there is no need to expose the wafer's dicing streets during solder bump formation. Instead, the combined contributions of the plating currents drawn through the substrate contact regions and the active semiconductor devices is sufficient to maintain the plating base layer and underlying pads at uniform potentials even though the plating base layer has a preferred thickness of less than about 0.075 μm which facilitates subsequent removal using a short duration etching step. These uniform and typically non-zero potentials can cause the rates of electroplating to be highly uniform across the wafer by limiting the amount of lateral current through the plating base layer. The uniformity of the electroplated solder bumps can also be enhanced by using high density controlled collapse chip connection (C4) ("flip-chip") technologies and by interspersing the ground and signal pads in a two-dimensional array on each "flip-chip" so that each signal pad has at least one ground pad as a nearest neighbor.

According to one embodiment of the present invention, an integrated circuit substrate is provided comprising a plurality of input and output circuits and electrostatic discharge protection (ESD) devices coupled thereto at a first face of the substrate, and a plurality of input and output pads electrically connected to the input and output circuits, respectively. A plating base layer is then formed on the substrate, in ohmic contact with the pads. The plating base layer may comprise a composite of two metal layers including a titanium adhesion layer having a thickness of less than about 375 Å, and a copper layer of similar thickness. The plating base layer is preferably formed to electrically "short" the plurality of input and output pads together. Solder bumps are then electroplated on the plating base layer (using a template) by drawing plating current vertically through the substrate from the first face to a second face thereof via a first plurality of parallel electrical paths formed by the plating base layer, the plurality of input and output signal pads and the plurality of input and output circuits and the ESD devices coupled thereto. In particular, plating current in the form of leakage current is drawn through the input and output circuits and the ESD devices coupled thereto.

For example, in the event an input device or circuit comprises an insulated gate field effect transistor (e.g., metal-oxide-semiconductor) field-effect transistor ("MOSFET") having a gate electrode coupled to an input pad, plating current is preferably drawn through the transistor's gate insulator (as leakage current) and into the substrate. This portion of the overall plating current can be substantial when the combined leakage currents through all the input circuits (and output circuits) are considered. In addition, plating current is also drawn through a plurality of ground pads which are preferably ohmically connected to the wafer through a plurality of highly doped contact regions. These ground pads are preferably interspersed closely among the input and output signal pads to limit lateral current flow in the ultra-thin plating base layer. Thus, according to the present invention, it is unnecessary to utilize a thick plating base layer or a wafer's dicing streets to "sink" lateral current during the electroplating step.

DESCRIPTION OF PREFERRED EMBODIMENTS

Figure 1A:
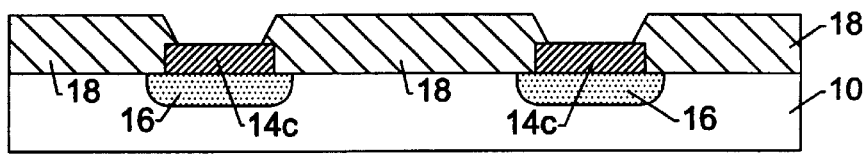
FIGS. 1A–1I illustrate cross-sectional views of intermediate structures illustrating a preferred method of electroplating solder bumps on an integrated circuit substrate, according to a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to alternative conductivity types such as N or P-type.

Referring now to FIGS. 1A–1I and FIGS. 2A–2B, preferred methods of electroplating solder bumps on integrated circuit substrates will be described. In particular, according to one embodiment of the present invention, a plurality of active semiconductor devices and circuits are preferably formed at a first face of a semiconductor substrate 10 of first conductivity type, using conventional techniques known to those skilled in the art. As illustrated best by FIGS. 2A–2B, these devices and circuits may comprise typical CMOS-based input and output circuits 12a, 12b with electrostatic discharge protection (ESD) devices such as input protection diodes and transistors coupled to power supply (Vdd, Vss) potentials. These input and output circuits 12a and 12b may be coupled directly to respective input and output signal pads 14a and 14b. A plurality of relatively highly doped substrate contact regions 16 of first conductivity type (e.g., N + or P +) may also be formed at the first face of the semiconductor substrate 10 using conventional techniques. These substrate contact regions 16 are illustrated best by FIGS. 1A–1I. One or more "well" regions of second conductivity type (not shown) may also be provided in the substrate 10.

Referring now specifically to FIG. 1A, during the course of forming the above-described devices and circuits using conventional techniques, a first electrically insulating layer 18 (e.g., SiO$_2$) is preferably formed on the first face of the substrate 10 and then photolithographically patterned. In particular, the first electrically insulating layer 18 may be patterned to expose the substrate contact regions 16. At least one layer of metallization (e.g., aluminum) is also preferably patterned to define the plurality of input and output signal pads 14a and 14b (and interconnect signal lines) and a plurality of power supply pads. These supply pads include a plurality of ground pads 14c which are formed in ohmic contact with the substrate contact regions 16.

Figure 1B:
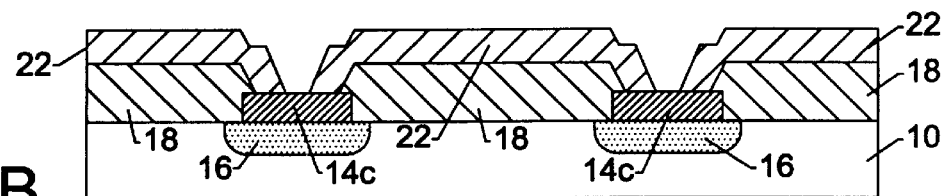
Figure 1C:
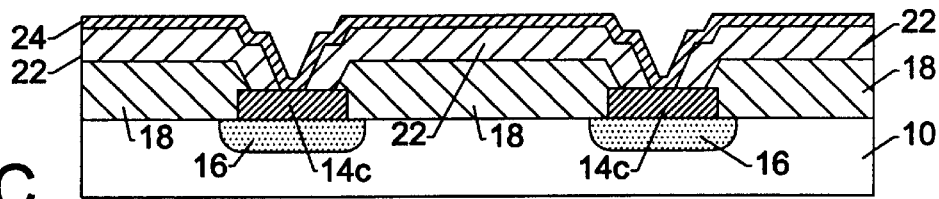

Then, as illustrated best by FIG. 1B, a blanket passivation layer 22 is preferably formed on the substrate 10 and patterned to define openings therein which expose the signal and power supply pads, using conventional processing techniques well known to those skilled in the art. An ultra-thin plating base layer 24, having a preferred thickness of less than about 0.075 μm (750 Å), is then formed on the substrate 10, as illustrated by FIG. 1C. In particular, in the event the substrate 10 is a semiconductor wafer comprising a two-dimensional array of chips therein, the plating base layer 24 is preferably formed to cover all of the chips and to electrically interconnect all the signal and power supply pads on all the chips together. However, the plating base layer 24 is preferably not formed in contact with a wafer's dicing streets which extend between adjacent chips. According to a preferred aspect of the present invention, the plating base layer 24 is preferably formed as a composite metal layer by sputtering a blanket adhesion layer of titanium having a thickness of less than about 375 Å and then sputtering a more highly conductive layer of copper of similar thickness on the adhesion layer.

Figure 1D:
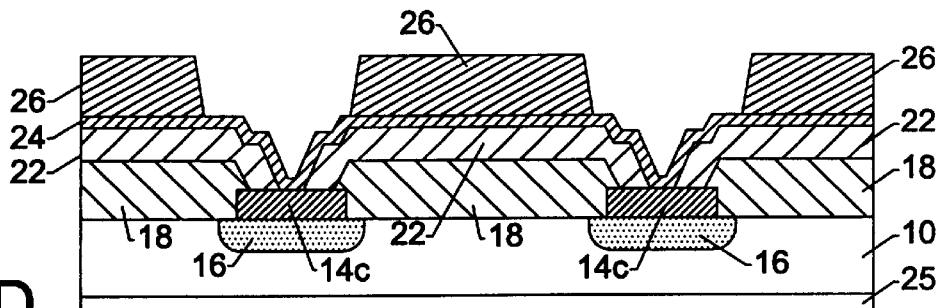
Figure 1E:
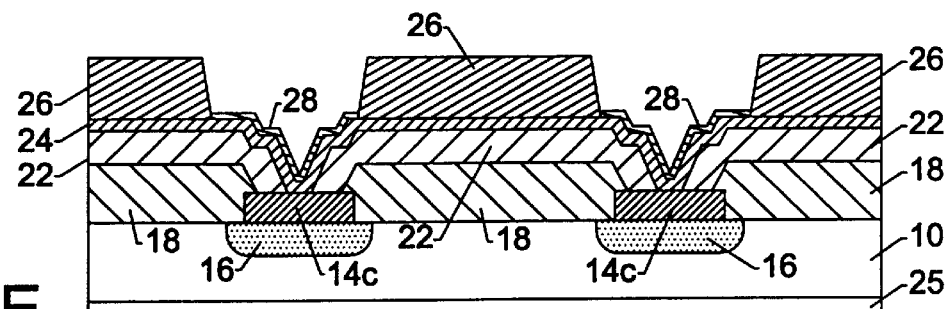

Referring now to FIG. 1D, a plating template 26 having an array of openings therein is then formed on the plating base layer 24. Preferably, the array of openings in the plating template 24 define the locations of the array of solder bumps to be formed on the signal and power supply pads. A backside wafer contact 25 is then attached to a second face of the substrate 10 and then a relatively short duration electroplating step is performed to define an array of wetting layers 28 in the openings in the plating template 24, as illustrated by FIG. 1E. These wetting layers 28 preferably comprise a layer of nickel having a thickness of about 5,000–25,000 Å. As will be understood by those skilled in the art, the electroplating step may be performed by exposing the plating base layer 24 to an electrolytic plating bath, and then biasing the backside wafer contact 25 to draw plating current through the substrate 10. In contrast to the prior art, however, plating current ($I_{plate}$) is not drawn through an array of dicing streets extending between adjacent chips. Instead, plating current ($I_{plate}$) is preferably drawn vertically through the substrate 10 from the first face to a second face thereof via a first plurality of parallel electrical paths formed by the plating base layer 24, the plurality of input and output signal pads 14a, 14b and the plurality of input and output circuits 12a, 12b and ESD devices coupled thereto.

Figure 2A:
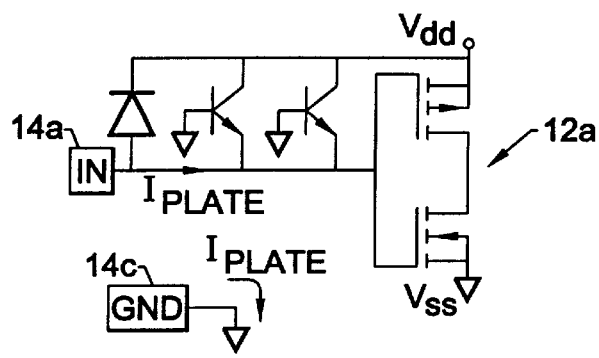
FIGS. 2A–2B illustrate CMOS input and output circuits which can be utilized to draw plating current from input and output pads, respectively, during the method of electroplating solder bumps illustrated by FIGS. 1A–1I.
Figure 2B:
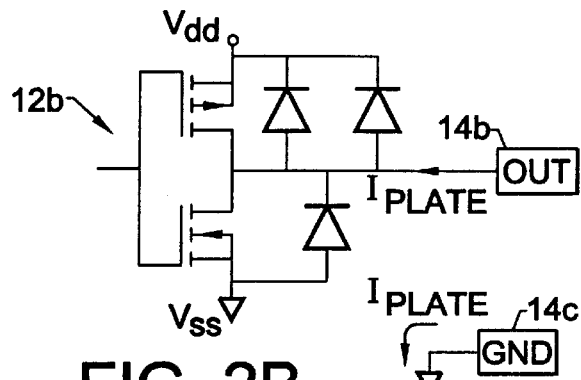

For example, in the event an input device or circuit 12a comprises an insulated gate field effect transistor (e.g., MOSFET) having a gate electrode coupled to an input pad 14a, as illustrated by FIG. 2A, plating current ($I_{plate}$) is preferably drawn as leakage current through the transistor's gate oxide and into the substrate 10. Plating currents may also be drawn as leakage currents through the ESD protection devices. These leakage currents can be substantial when the contributions of all the leakage paths through all the input circuits 12a (and output circuits 12b) are considered. Moreover, as determined by the inventors herein, these leakage currents can be drawn through state-of-the-art gate oxides without becoming permanently trapped and inducing threshold voltage ($V_{th}$) shifts. Thus, state-of-the-art attempts to scale integrated circuits to smaller and smaller dimensions, including thinner gate oxides having thicknesses in the range between about 40–100 Å, are compatible with the present invention.

In addition to leakage currents, plating current is also drawn directly through a plurality of ground pads 14c which are preferably ohmically connected to the substrate 10 through a plurality of highly doped contact regions 16. These ground pads 14c are preferably interspersed closely among the input and output signal pads 14a, 14b to limit the amount of lateral current in the ultra-thin plating base layer 24. Here, the combined contributions of all the plating currents ($I_{plate}$) drawn through the substrate contact regions 16 and the active semiconductor devices and circuits 12a, 12b is sufficient to maintain the plating base layer 24 and the underlying pads 14a–14c at uniform potentials even though the plating base layer 24 has a preferred thickness of less than about 0.075 μm. These uniform and typically non-zero potentials cause the rates of electroplating to be highly uniform across the wafer by limiting lateral current flow through the plating base layer 24.

Figure 1F:
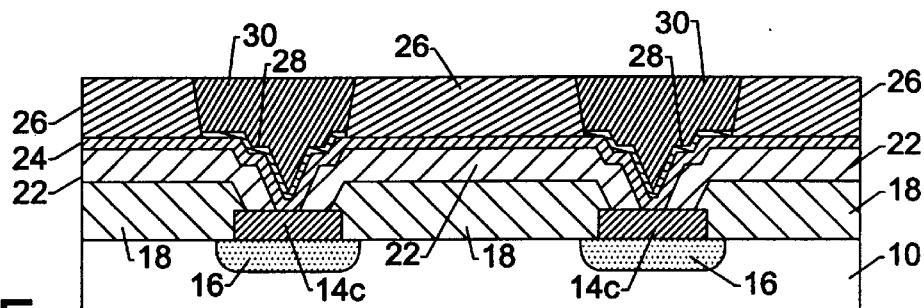
Figure 1G:
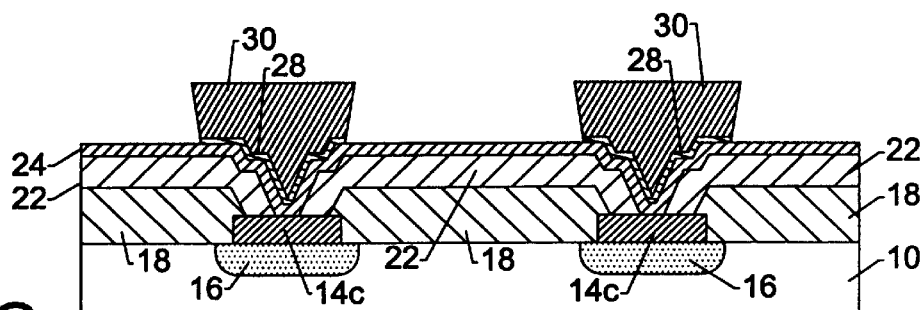
Figure 1H:
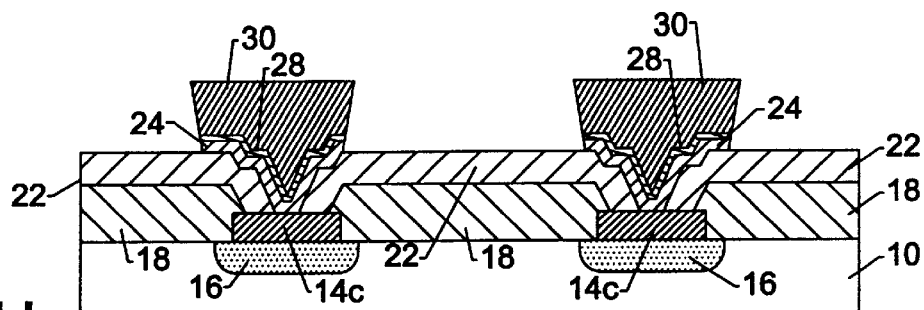
Figure 1I:
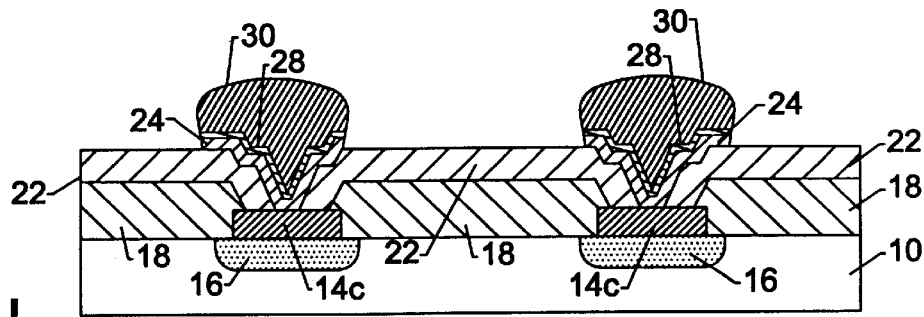

Referring now to FIGS. 1F–1G, an electroplating step is again performed to plate a plurality of PbSn solder bumps 30 on the corresponding plurality of wetting layers 28. Here, again, the plating current ($I_{plate}$) is preferably drawn as leakage current through the input and output circuits 12a, 12b and the ESD protection devices. In addition, plating current is drawn directly through a plurality of ground pads 14c which are preferably ohmically connected to the substrate 10 through the plurality of highly doped contact regions 16. The substrate 10 is then removed from the plating bath. The plating template 26 is then removed using conventional techniques, as illustrated by FIG. 1G. Then, as illustrated best by FIGS. 1H–1I, the ultra-thin plating base layer 24 is removed using a short duration etching step to expose the passivation layer 22 and electrically isolate the solder bumps 30 from each other. The solder bumps 30 can then be reflowed, as illustrated by FIG. 1I, or the reflow step can be performed before the step of etching the plating base layer 24 illustrated by FIG. 1H. Thus, the present invention is compatible with etch-before-reflow and reflow-before-etch techniques.

Figure 3:
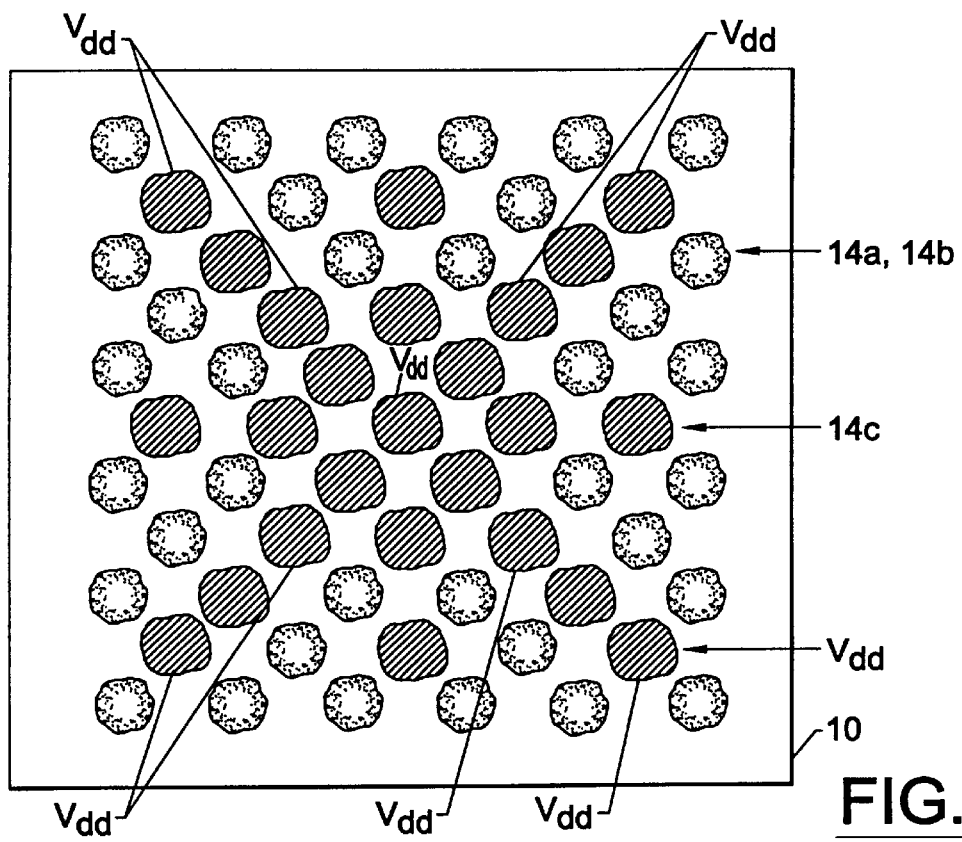
FIG. 3 is a plan view of a flip-chip containing solder bumps formed according to the method of FIGS. 1A–1I.

The uniformity of the electroplated solder bumps can also be enhanced by using high density controlled collapse chip connection (C4) ("flip-chip") technologies and by interspersing the ground and signal pads on each "flip-chip" so that each signal pad has at least one ground pad as a nearest neighbor. In particular, a preferred arrangement of ground, power and signal pads on a flip-chip is best illustrated by FIG. 3. As determined by the inventors herein, at least 10–25% of the contact pads should be ground pads to maintain $I_{plate}$ at a sufficiently high level during the wetting layer and solder bump electroplating steps.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of electroplating solder bumps on an integrated circuit substrate comprising a plurality of semiconductor input devices at a first face thereof and a plurality of input pads electrically connected to the plurality of semiconductor input devices, comprising the steps of:

forming a plating base layer which electrically shorts the plurality of input pads together, on the substrate; and electroplating solder bumps on the plating base layer by drawing plating current vertically through the substrate from the first face to a second face thereof via a first plurality of parallel electrical paths which extend through the plating base layer and the plurality of semiconductor input devices.

2. The method of claim 1, wherein the plurality of semiconductor input devices comprise insulated gate electrodes electrically connected to the plurality of input pads; and wherein said electroplating step comprises drawing plating current through the insulated gate electrodes and into the substrate.

3. The method of claim 2, wherein said step of forming a plating base layer comprises forming a plating base layer having a thickness of less than about 0.075 μm, on the substrate.

4. The method of claim 3, wherein said electroplating step is preceded by the steps of forming a plating template having openings therein, on the plating base layer; and wherein said electroplating step comprises electroplating solder wetting layers in the openings in the plating template.

5. The method of claim 3, wherein said plating base layer comprises a composite of a titanium adhesion layer having a thickness of less than about 375 Å and a copper conductive layer having a thickness of less than about 375 Å.

6. The method of claim 5, further comprising the steps of reflowing the electroplated solder bumps and etching the plating base layer.

7. The method of claim 2, wherein the integrated circuit substrate further comprises a plurality of electrostatic discharge protection devices coupled to the plurality of semiconductor input devices and the plurality of input pads; and wherein said electroplating step comprises drawing plating current through the ESD protection devices and into the substrate.

8. A method of electroplating solder bumps on an integrated circuit substrate, comprising the steps of:

forming a plurality of semiconductor devices and substrate contact regions at a first face of a semiconductor substrate;

forming first and second pluralities of contact pads electrically connected to the substrate contact regions and the semiconductor devices, respectively, on the semiconductor substrate;

forming a plating base layer which electrically shorts the first and second pluralities of contact pads together, on the semiconductor substrate;

forming a plating template having openings therein, on the plating base layer;

forming a backside contact on a second face of the semiconductor substrate; and electroplating solder bumps in the openings in the plating template by drawing plating current vertically through the substrate via a first plurality of electrical paths formed by the plating base layer, the first plurality of contact pads, the substrate contact regions and the backside contact, while simultaneously drawing additional plating current vertically through the substrate via a second plurality of electrical paths formed by the plating base layer, the second plurality of contact pads, the semiconductor devices and the backside contact.

9. The method of claim 8, further comprising the step of etching the plating base layer using the solder bumps as an etching mask.

10. The method of claim 9, wherein said step of forming the plating template comprises forming a plating template having openings therein which extend opposite the first and second pluralities of contact pads.

11. The method of claim 10, wherein said step of forming first and second pluralities of contact pads is preceded by the step of forming a first electrically insulating layer on the first face of the semiconductor substrate.

12. The method of claim 11, wherein said step of etching the plating base layer is followed by the step of dividing the semiconductor substrate into a plurality of integrated circuit chips by dicing the semiconductor substrate along a plurality of dicing streets.

13. The method of claim 12, wherein said step of forming a first electrically insulating layer on the first face of the semiconductor substrate comprises forming a first electrically insulating layer on the plurality of dicing streets.

14. The method of claim 13, wherein said step of forming a plating base layer is preceded by the steps of forming a passivation layer on the first and second pluralities of contact pads and then patterning the passivation layer to expose the first and second pluralities of contact pads.

15. The method of claim 14, wherein said step of forming a plating base layer comprises sputtering a first metal layer on the patterned passivation layer and on the exposed first and second pluralities of contact pads.

16. The method of claim 14, wherein said step of forming a plating base layer comprises sputtering a conductive layer containing titanium on the exposed first and second pluralities of contact pads.

17. The method of claim 15, wherein said electroplating step comprises electroplating a wetting layer in the openings in the plating template.

18. The method of claim 17, wherein said step of forming a plating base layer comprises sputtering a layer of titanium having a thickness of less than about 0.05 μm on the patterned passivation layer and on the exposed first and second pluralities of contact pads.

19. The method of claim 18, wherein said electroplating step comprises electroplating a wetting layer containing nickel in the openings in the plating template.

20. The method of claim 18, wherein said electroplating step comprises drawing plating current through the substrate contact regions and the semiconductor devices, but not through the dicing streets.

21. The method of claim 13, wherein said electroplating step comprises drawing plating current through the substrate contact regions and the semiconductor devices, but not through the dicing streets.

22. A method of electroplating solder bumps on an integrated circuit substrate containing a plurality of active semiconductor devices in the substrate and a plurality of contact pads electrically connected to the active semiconductor devices, comprising the steps of:

forming a plating base layer which electrically shorts the plurality of contact pads together, on the substrate; and electroplating solder bumps on the plating base layer by drawing plating current vertically through the substrate via a first plurality of parallel electrical paths formed by the plating base layer and the plurality of active semiconductor devices.

23. The method of claim 22, wherein said step of forming a plating base layer is preceded by the step of forming a patterned passivation layer on the plurality of contact pads; and wherein said step of forming a plating base layer comprises forming an adhesion layer comprising titanium on the passivation layer and in ohmic contact with the plurality of contact pads.

24. The method of claim 22, wherein said step of forming a plating base layer comprises sputtering a metal adhesion layer having a thickness of less than about 0.05 μm on the plurality of contact pads; and wherein said electroplating step is preceded by the step of forming a plating template having openings therein on the metal adhesion layer.

25. The method of claim 24, wherein said electroplating step comprises electroplating a wetting layer in the openings in the plating template.

26. The method of claim 25, further comprising the steps of etching the plating base layer using the solder bumps as an etching mask; and then dividing the substrate into a plurality of integrated circuit chips by dicing the substrate along a plurality of dicing streets.

27. The method of claim 26, wherein said electroplating step comprises drawing plating current through the plurality of active semiconductor devices, but not through the dicing streets.

* * * * *